(12) United States Patent
Saito et al.

(10) Patent No.: US 6,503,562 B1
(45) Date of Patent: Jan. 7, 2003

(54) SEMICONDUCTOR FABRICATION APPARATUS AND FABRICATION METHOD THEREOF

(75) Inventors: Kazuyoshi Saito, Narita (JP); Youji Takagi, Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/743,764

(22) PCT Filed: May 17, 2000

(86) PCT No.: PCT/JP00/03164

§ 371 (c)(1),
(2), (4) Date: Jan. 16, 2001

(87) PCT Pub. No.: WO00/70661

PCT Pub. Date: Nov. 23, 2000

(30) Foreign Application Priority Data

May 17, 1999 (JP) .............................. 11-136064

(51) Int. Cl.$^7$ ................................ C23C 16/40
(52) U.S. Cl. .................... 427/248.1; 427/255.26; 427/255.4; 427/255.5; 156/345; 118/715; 118/729; 118/730

(58) Field of Search .................. 156/345; 118/715, 118/729, 730; 427/248.1, 127, 255.26, 255.4, 255.5

(56) References Cited

U.S. PATENT DOCUMENTS 5,089,066 A * 2/1992 Hamada et al. ............. 148/302
5,879,128 A * 3/1999 Tietz et al. .................. 414/757

* cited by examiner

Primary Examiner—Timothy Meeks
(74) Attorney, Agent, or Firm—Moser, Patterson & Sheridan

(57) ABSTRACT

An epitaxial growth system is provided with a susceptor driving mechanism for rotationally driving a susceptor in a process chamber and this susceptor driving mechanism has a support shaft coupled to the susceptor, a driven portion, and an annular member with a plurality of permanent magnets arranged outside the driven portion. The driven portion is constructed in such structure that a coating for corrosion prevention consisting of a nickel coating, a chromium coating, and a metal oxide film formed by a passivation treatment with ozone is provided on a surface of a magnetic member.

11 Claims, 3 Drawing Sheets

SEMICONDUCTOR FABRICATION APPARATUS AND FABRICATION METHOD THEREOF

TECHNICAL FIELD

The present invention relates to semiconductor fabrication apparatus such as epitaxial growth systems or the like.

BACKGROUND ART

The ordinary epitaxial growth systems are equipped with a process chamber, into which a reactant gas is introduced and which is provided with a susceptor for supporting a semiconductor wafer, and a driving unit for rotating this susceptor. This driving unit is, for example, a unit in which a driven part consisting of a magnetic material is fixed to lower part of a support shaft supporting the susceptor from the bottom and in which an annular member with a plurality of magnets arranged at predetermined intervals is placed outside (or around) the driven portion. This annular member is connected to a motor.

In the system of this structure, when the annular member is rotated by the motor, magnetic attraction and magnetic repulsion acts between the magnets and the driven portion. As a result, the driven portion rotates in response to the rotation of the annular member, whereby the susceptor rotates through the support shaft.

DISCLOSURE OF THE INVENTION

Incidentally, deposition processes in the semiconductor fabrication apparatus such as the epitaxial systems or the like employ a corrosive gas such like chlorine-based gas as the reactant gas, which can corrode the member made of the magnetic material and other members. In many such conventional systems, the surface is treated by a surface treatment of nickel plating or the like in order to prevent the corrosion of the driven portion.

However, the inventors investigated the conventional systems and found that the magnetic material of the driven portion did not always have sufficient corrosion resistance and there were desires for further improvement.

Therefore, the present invention has been accomplished under such circumstances and an object of the invention is to provide a semiconductor fabrication apparatus improved in corrosion resistance of the magnetic material and a fabrication method thereof.

In order to accomplish the above object, a semiconductor fabrication apparatus according to the present invention comprises a process chamber into which a reactant gas is introduced and which has a pedestal for supporting an article to be processed, and a pedestal drive for rotating the pedestal; the pedestal drive comprises a shaft member which is coupled to the pedestal and which comprises a driven portion mainly comprised of a magnetic material, and a member which has a plurality of magnets arranged outside the driven portion and which can rotate the driven portion; and the driven portion has a metal coating on a surface of the magnetic material and a metal oxide film on the metal coating.

In other words, the semiconductor fabrication apparatus of the present invention is a semiconductor fabrication system comprising the process chamber into which the reactant gas is introduced, the pedestal for supporting the article, which is disposed in the process chamber, and the pedestal driving means (drive) for rotating the pedestal, the pedestal driving means comprising the shaft member coupled to the pedestal and having the driven portion of the magnetic material, and the member placed outside the driven portion and having a plurality of magnets for imposing a rotational force on the driven portion, wherein the metal coating is formed on the surface of the driven portion and the metal oxide film is further formed on the metal coating.

When the metal oxide film is formed on the metal coating laid on the surface of the driven portion in this way, for example, by a passivation treatment, dissolution, reaction, or the like of the metal coating becomes hard to occur, which improves the corrosion resistance of the magnetic material forming the driven portion.

It is preferable to form the metal oxide film by reaction of the metal coating with ozone. Namely, the metal oxide film is preferably a film formed by combination of the metal coating with ozone. This permits the metal oxide film to be formed on the metal coating at ordinary temperature (for example, at or below 30° C.), thereby decreasing variation in magnetic characteristics of the magnetic material.

Further, the metal coating is more preferably a coating containing at least either one of nickel and chromium. Particularly, the metal coating is more preferably made of at least one of a nickel coating and a chromium coating. In this case, for example, the surface of the driven portion is given nickel plating and this nickel plating is covered by chromium plating. This can prevent the corrosion of the driven portion at relatively low cost.

A method of fabricating the semiconductor fabrication apparatus according to the present invention is a method of effectively fabricating the semiconductor fabrication apparatus of the present invention. Namely, the method is a fabrication method of a semiconductor fabrication apparatus comprising a process chamber into which a reactant gas is introduced and which has a pedestal for supporting an article to be processed, a shaft member which is coupled to the pedestal and which has a driven portion mainly comprised of a magnetic material, and a member which has a plurality of magnets arranged outside the driven portion and which can rotate the driven portion (or which can impose a rotational force on the driven portion), the fabrication method comprising forming a metal coating on a surface of the magnetic material and further forming a metal oxide film on the metal coating.

Specifically, it is preferable to form the metal oxide film by supplying ozone onto the metal coating to bring about reaction between the metal coating and the ozone. Further, it is more preferable to form the metal coating by depositing a film containing at least either one of nickel and chromium on the surface of the magnetic material.

BEST MODE FOR CARRYING OUT THE INVENTION

Figure 1:
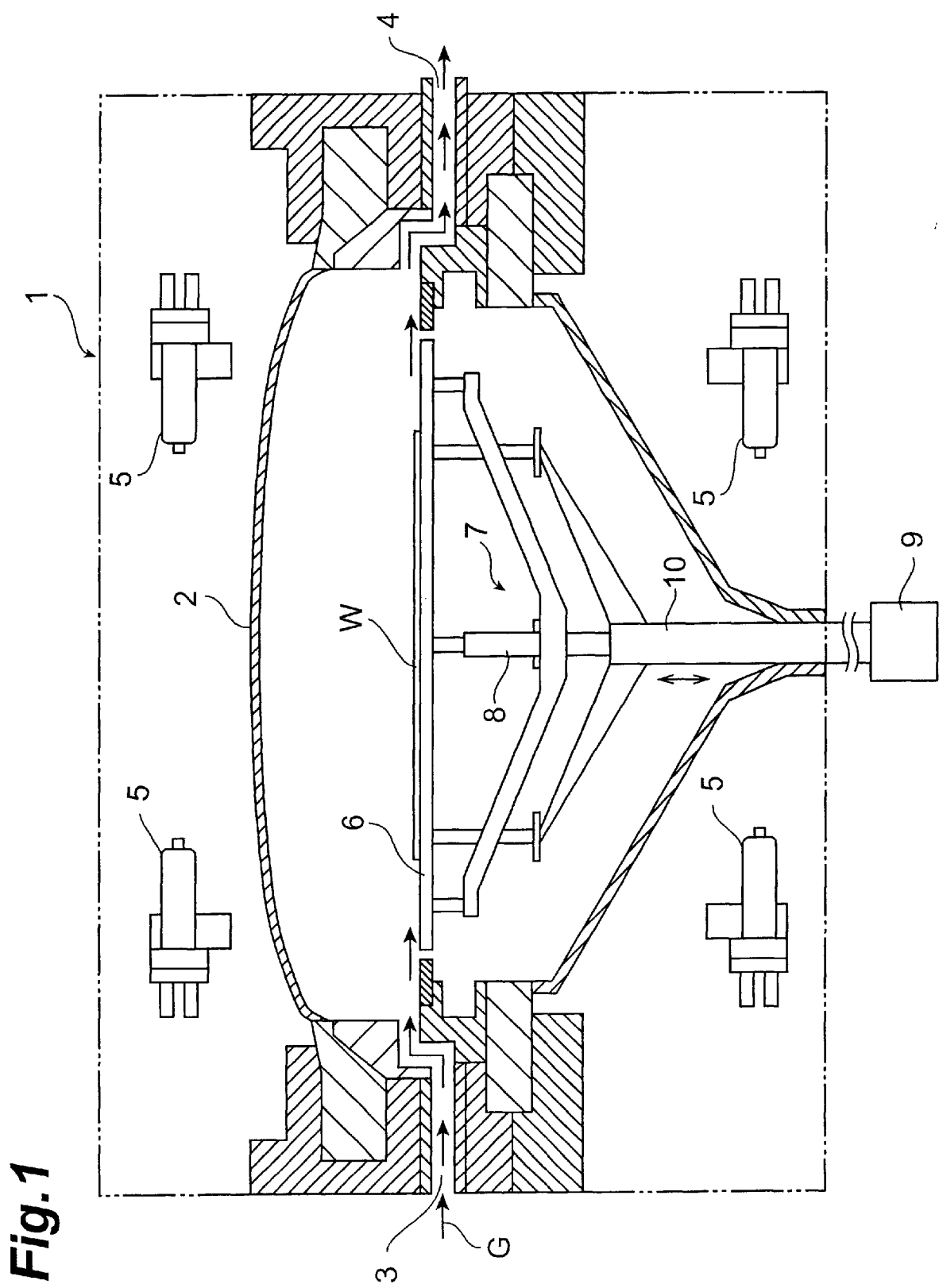
FIG. 1 is a schematic, cross-sectional view to show the schematic structure of a preferred embodiment of the semiconductor fabrication apparatus according to the present invention, which schematically shows an example of the epitaxial growth system as the semiconductor fabrication apparatus according to the present invention.

A preferred embodiment of the present invention will be described below in detail with reference to the accompanying drawings. In the description of the drawings the same elements will be designated by the same reference symbols and redundant description will be omitted. The positional relations including the vertical relation, the horizontal relation, etc. will be based on those in the drawings unless otherwise stated in particular.

FIG. 1 is a schematic, cross-sectional view to show the schematic structure of the preferred embodiment of the semiconductor fabrication apparatus according to the present invention, which schematically shows an epitaxial growth system of a single wafer processing type for carrying out a deposition process of a single silicon wafer as an article to be processed, at one time.

In the same figure, the epitaxial growth system 1 is provided with a process chamber 2 made of quartz glass. The side wall of this process chamber 2 is provided with a gas supply port 3 and a gas exhaust port 4. A plurality of halogen lamps 5 are radially arranged above and below the process chamber 2.

A disklike susceptor 6 (pedestal) made of a graphite material coated with silicon carbide and saving to support a wafer W as an article to be processed is disposed in the process chamber 2. This susceptor 6 is rotationally driven by a susceptor driving mechanism 7, which is a pedestal drive.

Further, the susceptor driving mechanism 7 has a support shaft 8 vertically standing in the lower part of the process chamber 2 and a magnetic coupling part 9 provided through a lift mechanism 10 below the support shaft 8. The support shaft 8 is made of quartz glass and horizontally supports the susceptor 6 at three points from the back. The lift mechanism 10 is vertically moved by an unrepresented driving device to lift the wafer W from the lower part.

Figure 2:
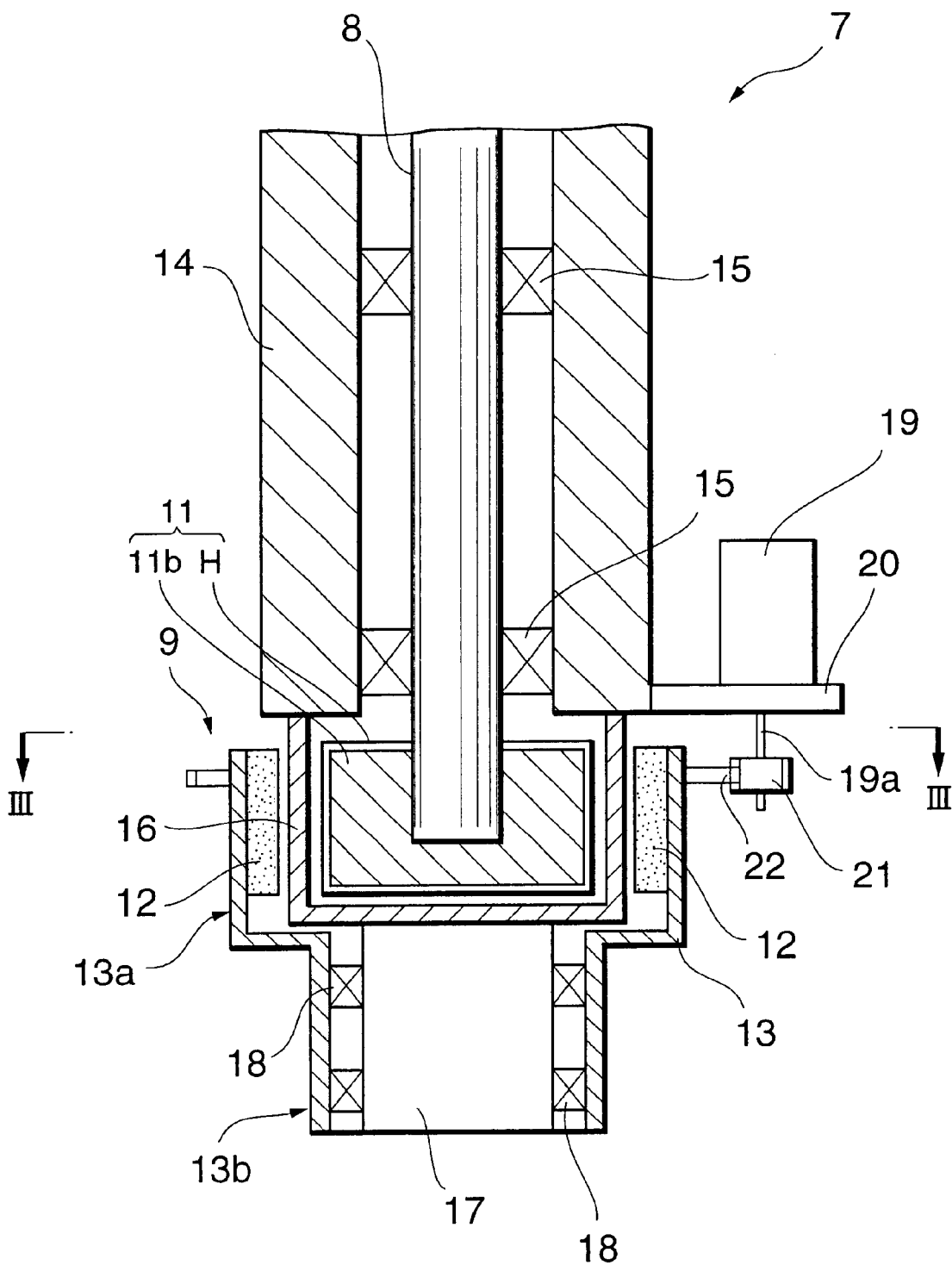
FIG. 2 is a vertical, cross-sectional view to show the structure of major part of the preferred embodiment of the semiconductor fabrication apparatus according to the present invention, which shows specific structure of the magnetic coupling part illustrated in FIG. 1.
Figure 3:
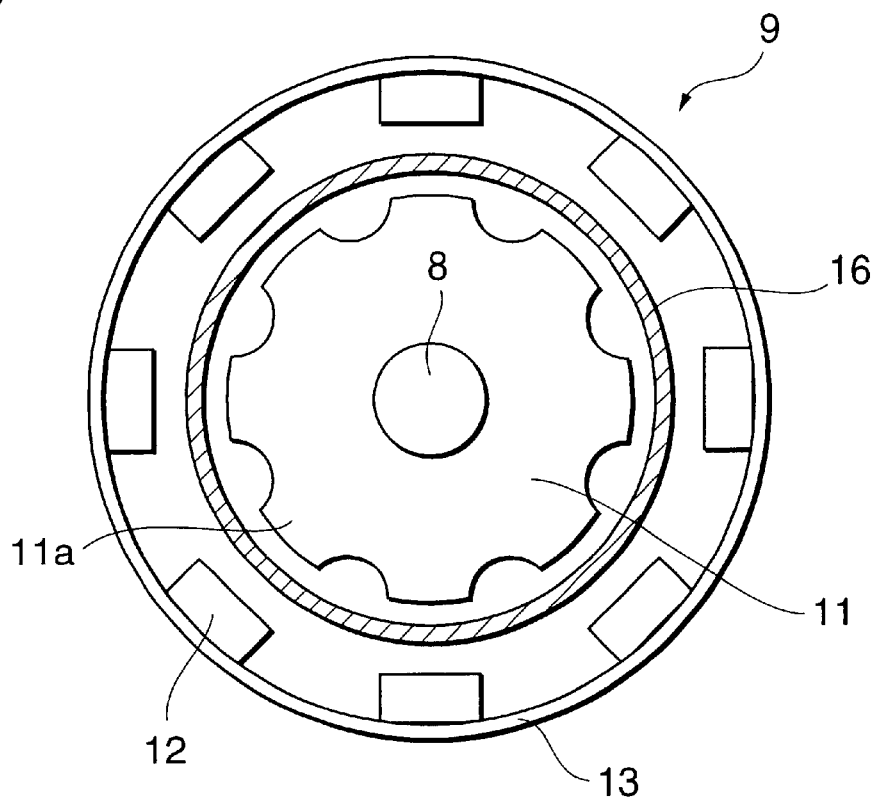
FIG. 3 is a horizontal, cross-sectional view to show the structure of major part of the preferred embodiment of the semiconductor fabrication apparatus according to the present invention, which shows a cross section along line III—III of FIG. 2.

FIGS. 2 and 3 are a vertical, cross-sectional view and a horizontal, cross-sectional view, respectively, to show the structure of major part of the epitaxial growth system 1 illustrated in FIG. 1, and show the specific structure of the magnetic coupling part 9. FIG. 3 is a drawing to show a cross section along the line III—III of FIG. 2.

In the figures, the magnetic coupling part 9 is basically constructed in such structure that an annular member 13 having a plurality of (eight herein) platelike permanent magnets 12 is disposed outside (or around) the driven portion 11 fixed to the lower part of the support shaft 8. As described, a shaft member is composed of the support shaft 8 and the driven portion 11.

The driven portion 11 is mainly made of a magnetic material, for example, a magnetic member 11b of stainless steel SUS440, and a coating H for prevention of corrosion is laid on the surface of the magnetic member 11b. As illustrated in FIG. 3, eight teeth 11a corresponding to the number of permanent magnets 12 are formed in the peripheral edge (more specifically, the outer surface) of the driven portion 11.

Further, the driven portion 11 is housed in a cuplike housing frame 16 attached to the lower part of a support frame 14. This housing frame 16 is fixed at the opening end in close fit without clearance to the lower end of the support frame 14 in order to isolate the internal surface of the support frame 14 from the atmosphere.

On the other hand, the plurality of permanent magnets 12 are arranged at predetermined intervals and rotationally drive the driven portion 11 by their magnetism, or impose a rotational force on the driven portion 11. Further, the support shaft 8 is rotatably supported through bearings 15 on the cylindrical support frame 14.

Figure 4:
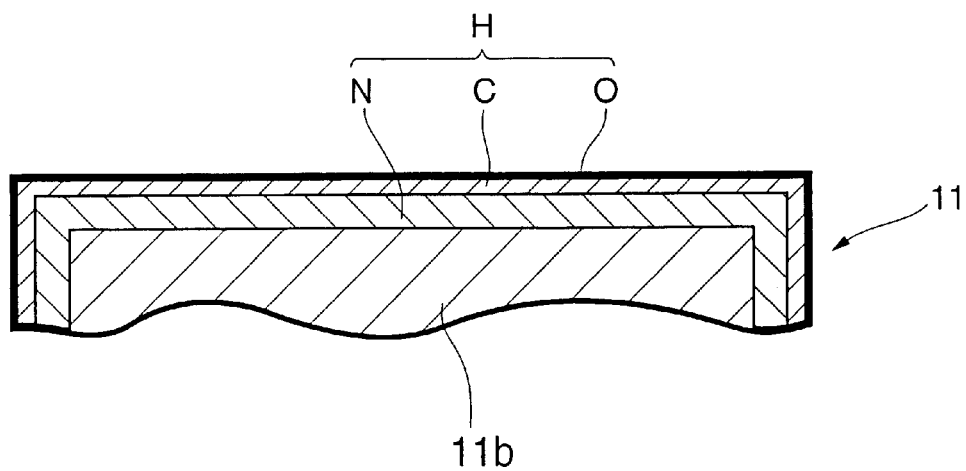
FIG. 4 is a vertical, cross-sectional view (partly omitted) to show the structure of another major part of the preferred embodiment of the semiconductor fabrication apparatus according to the present invention, which shows the structure of the driven portion.

FIG. 4 is a vertical, cross-sectional view (partly omitted) to show the structure of another major part of the epitaxial growth system 1, which shows the structure of the driven portion 11, particularly, the details of the coating H. In the same figure, the coating H consists of a nickel coating N (metal coating) formed on the surface of the magnetic member 11b being the main part of the driven portion 11, a chromium coating C (metal coating) formed on this nickel coating N, and a metal oxide film O (metal oxide film) formed on this chromium coating C.

Here a surface treatment for forming such a coating H on the driven portion 11 can be carried out, for example, by the following method under the ambience of ordinary temperature (for example, at 20° C.).

First, the nickel coating N is formed on the surface of the magnetic member 11b by electroless nickel plating and thereafter the chromium coating C is formed on the surface of the nickel coating N by chromium plating. Such double plating of the nickel plating and the chromium plating provides the advantage that the combination of nickel with chromium imparts particularly excellent corrosion resistance to the driven portion.

Next, the magnetic member 11b coated with the nickel coating N and the chromium coating C is put into a furnace. Further, ozone gas is charged into the furnace to form the metal oxide film O of chromium oxide ($Cr_2O_3$) on the chromium coating C.

After this passivation treatment with ozone, dissolution of nickel and chromium, other chemical reaction, etc. becomes hard to occur. Fine recesses or microscopic through holes like pinholes are also covered with accuracy, so that great improvement can be achieved in the corrosion resistance of the magnetic member 11b forming the driven portion 11. Further, since ozone, which permits the treatment at ordinary temperature, is used as an oxidizer, variation can be suppressed in the magnetic characteristics of the magnetic member 11b and, in turn, the driven portion 11.

Now, returning to FIGS. 2 and 3, the structure of the magnetic coupling part 9 will be described in further detail. As described previously, the annular member 13 for imposing the rotational force on the driven portion 11 is composed of a magnetic mount portion 13a and a support portion 13b placed below the magnetic mount portion 13a and having the diameter smaller than the magnetic mount portion 13a.

On the internal surface of the magnet mount portion 13a, the plurality of permanent magnets 12 are mounted opposite the driven portion 11 with the housing frame 16 in between (see FIG. 3). The support portion 13b is rotatably supported through bearings 18 on a support frame 17 coupled to the lower part of the housing frame 16.

The housing frame 16 placed between the permanent magnets 12 and the driven portion 11 is made of a material that has no substantial effect on the rotational operation of the driven portion 11 induced by the magnetism of the permanent magnets 12 (for example, stainless steel SUS316).

The annular member 13 having such structure is rotationally driven by a driving motor 19. This driving motor 19 is fixed to a mounting frame 20 provided in the lower part of the support frame 14. A pinion 21 is attached to an output shaft 19a of the driving motor 19. This pinion 21 gears with a ring gear 22 provided on the outer surface of the magnet mount portion 13a of the annular member 13.

In this magnetic coupling part 9, when the driving motor 19 is actuated, rotation thereof is transmitted through the pinion 21 and ring gear 22 to the annular member 13, so as to rotate the annular member 13.

In this state, magnetic attraction and magnetic repulsion acts between the plurality of permanent magnets 12 and the driven portion 11 mainly comprised of the magnetic member 11b. This causes the driven portion 11 to rotate which following (or "with being pulled by") the rotation of the annular member 13. Then this rotation of the driven portion 11 rotates the susceptor 6 through the support shaft 8.

In the epitaxial growth system 1 constructed in the above structure, the wafer W is mounted on the susceptor 6 and the susceptor 6 is rotated by the susceptor driving system 7 in a state in which the wafer W is heated by the halogen lamps 5. In conjunction therewith, the reactant gas G, e.g. halogenated silane gas such as trichlorosilane ($SiHCl_3$) gas or dichlorosilane ($SiH_2Cl_2$) gas, is supplied through the gas support port 3 into the process chamber 2.

This makes the reactant gas G flow in a laminar flow state along the surface of the wafer W heated at the predetermined temperature, whereby a single crystal of silicon is epitaxially grown on the wafer W to form a thin film thereon.

Since the surface of the driven portion 11 is coated with the double plating of nickel and chromium (the nickel coating N and the chromium coating C) and the metal oxide film O formed by the passivation treatment with ozone gas is further provided on the double plating, the driven portion 11 mainly comprised of the magnetic material can be adequately prevented from being corroded during the epitaxy, in spite of the use of the corrosive reactant gas G. This can reduce metal contamination, i.e., metal contamination of the wafer W or the thin film deposited on the wafer W.

Since the surface oxidation can be conducted at the ordinary temperature, there is little change in the magnetic characteristics of the magnetic member 11b and, in turn, the driven portion 11. This permits the driven portion 11 to rotate on a stable basis.

The above described the preferred embodiment of the present invention, but it is needless to mention that the present invention is not limited to the above embodiment. For example, the above embodiment was the example in which after the nickel plating was laid on the surface of the magnetic member 11b forming the driven portion 11, the chromium plating was deposited thereon and the passive oxide film was further formed thereon with ozone; but the passive oxide film may also be formed on the nickel plating or on the chromium plating with ozone. Namely, the metal coating may be either one of the nickel coating N and the chromium coating C.

The metal coating does not have to be limited to the nickel plating and chromium plating, but it may be formed in such a manner that a film containing another metal component is formed on the magnetic member 11b and a passive oxide film is formed on the metal film with ozone. Further, the gas used for formation of the metal oxide film is not limited particularly to the ozone gas, but it may be either one of other gases.

Further, the present invention can also be applied to the semiconductor fabrication apparatus other than the epitaxial growth system 1, for example, to all apparatus equipped with a rotatable pedestal for supporting an article to be processed, such as CVD systems, dry etching systems, and so on.

INDUSTRIAL APPLICABILITY

As detailed above, the present invention can improve the corrosion resistance of the magnetic material, which results in further improvement of the corrosion resistance of the driven portion, so as to reduce the metal contamination of the article to be processed, because the metal coating is formed on the surface of the driven portion mainly comprised of the magnetic material and the metal oxide film is further formed on the metal coating. Since the metal oxide film is formed with the ozone gas, the surface treatment can be conducted at the ordinary temperature, which can adequately prevent the surface treatment from affecting the magnetic characteristics of the magnetic material.

What is claimed is:

1. A semiconductor fabrication apparatus comprising a process chamber into which a reactant gas is introduced and which has a pedestal for supporting an article to be processed, and a pedestal drive for rotating the pedestal,
    wherein said pedestal drive comprises a shaft member which is coupled to said pedestal and which comprises a driven portion mainly comprised of a magnetic material, and an annular member which has a plurality of magnets arranged outside the driven portion and which can rotate the driven portion,
    wherein said driven portion rotates following the rotation of said annular member and has a metal coating on a surface of said magnetic material and a metal oxide film on the metal coating.

2. The semiconductor fabrication apparatus according to claim 1, wherein said metal oxide film is formed by reaction between said metal coating and ozone.

3. The semiconductor fabrication apparatus according to claim 1, wherein said metal coating contains at least either one of nickel and chromium.

4. The semiconductor fabrication apparatus according to claim 1, wherein said magnetic material is mainly made of magnetic stainless steel.

5. The semiconductor fabrication apparatus according to claim 1, wherein said metal coating comprises of a nickel coating and a chromium coating formed on said nickel coating.

6. A method of fabricating a semiconductor fabrication apparatus comprising a process chamber into which a reactant gas is introduced and which has a pedestal for supporting an article to be processed, a shaft member which is coupled to the pedestal and which has a driven portion mainly comprised of a magnetic material, and an annular member which has a plurality of magnets arranged outside the driven portion and which can impose a rotational force on the driven portion,
    wherein said driven portion rotates following the rotation of said annular member,
    said method comprising forming a metal coating on a surface of said magnetic material and further forming a metal oxide film on the metal coating.

7. The fabrication method of the semiconductor fabrication apparatus according to claim 6, wherein said metal oxide film is formed by supplying ozone onto said metal coating to bring about reaction between the metal coating and the ozone.

8. The fabrication method of the semiconductor fabrication apparatus according to claim 6, wherein a film containing at least either one of nickel and chromium is formed as said metal coating on a surface of said magnetic material.

9. The fabrication method of the semiconductor fabrication apparatus according to claim 6, wherein said magnetic material is mainly made of magnetic stainless steel.

10. The fabrication method of the semiconductor fabrication apparatus according to claim 6, wherein a film comprising of a nickel coating and a chromium coating formed on said nickel coating is formed as said metal coating on a surface of said magnetic material.

11. A semiconductor fabrication apparatus comprising a process chamber into which a reactant gas is introduced and which has a pedestal for supporting an article to be processed, and a pedestal drive for rotating the pedestal, wherein said pedestal drive comprises a shaft member which is coupled to said pedestal and which comprises a driven portion mainly comprised of a magnetic material, and an annular member which has a plurality of magnets arranged outside the driven portion and which can impose a rotational force on the driven portion, wherein said driven portion rotates following the rotation of said annular member and comprises a metal coating containing at least either one of nickel and chromium and formed on a surface of said magnetic material, and a metal oxide film formed on the metal coating by reaction between the metal coating and ozone.

* * * * *